United States Patent [19]

Dame

[11] 3,801,831

[45] Apr. 2, 1974

[54] VOLTAGE LEVEL SHIFTING CIRCUIT

[75] Inventor: John S. Dame, Oak Park, Ill.

[73] Assignee: Motorola Inc., Franklin Park, Ill.

[22] Filed: Oct. 13, 1972

[21] Appl. No.: 297,547

[52] U.S. Cl. .................. 307/251, 307/304, 307/205

[51] Int. Cl. .......................................... H03k 17/60

[58] Field of Search........ 307/205, 221 C, 251, 239, 307/279, 304

[56] References Cited

UNITED STATES PATENTS 3,612,908 10/1971 Heimbicner ........................ 307/251

FOREIGN PATENTS OR APPLICATIONS 1,196,216 6/1970 Great Britain ...................... 307/279

1,942,420 2/1970 Germany ............................ 307/205

OTHER PUBLICATIONS

Gaensslen, "Non-Complementary Static Shift Register", Vol. 13 No. 5, Oct. 1970, IBM Tech. Disclosure Bull., Pages 1,349–1,350

Dailey, "An Isolating NDRO Complementary Symmetry IGFET...", IBM Tech. Dis. Bull., Vol. 13 No. 8, Jan. 1971, Pages 2,132–2,133

*Primary Examiner*—Rudolph V. Rolinec

*Assistant Examiner*—R. E. Hart

*Attorney, Agent, or Firm*—Eugene A. Parsons; Vincent J. Rauner

[57] ABSTRACT

A voltage level shifting circuit includes a pair of transistors of one conductivity type arranged in a bistable configuration, and a pair of transistors both of another conductivity type each arranged as a switch for operating the bistable circuit. One of the two switches is operative to conduct in response to a first voltage or reference potential. The bistable is operative in response to the first switch being conductive to switch to a first state and couple the reference potential to the output. The bistable is operative in response to the second switch being conductive to switch to the second state and couple a second voltage greater than the first voltage to the output.

19 Claims, 2 Drawing Figures

VOLTAGE LEVEL SHIFTING CIRCUIT

BACKGROUND OF THE INVENTION

Level shifting circuits are circuits which operate in response to an input signal which varies between two fixed voltages to develop another signal which varies between two fixed voltages, one of which or both of which may be different than the input signal voltages. Previous level shifting circuits often employ current source configurations for providing the level shifting function. Current source circuit configurations inherently require substantial amounts of currents for their proper operation and also when in a quiescent mode. Furthermore, such circuits have required a number of additional components in order to stabilize their operating points. The complicated circuitry ultimately developed was not easily manufacturable in integrated circuit form.

SUMMARY OF THE INVENTION

It is, therefore, an object of this invention to provide an improved voltage level shifting circuit.

It is another object of this invention to provide a voltage level shifting circuit which requires a little current when in a quiescent mode.

Yet another object of this invention is to provide a voltage level shifting circuit which is easily manufacturable in integrated circuit form.

In practicing this invention, a voltage level shifting circuit is provided which responds to a signal which varies between a first voltage and reference potential to produce an output signal which varies between a second voltage and reference potential. The voltage level shifting circuit includes a first pair of transistors of one conductivity type arranged in a bistable configuration, and a second pair of transistors both of another conductivity type which each act as a switch. The bistable circuit has a first state for coupling the second voltage to the output and a second state for coupling the reference potential to the output. Each transistor switch has a principal electrode coupled to the identical principal electrode of one transistor in the bistable circuit. The first and second transistor switches are operative to conduct in response to one of the first voltage or reference potential. The bistable circuit is operative in response to the third transistor conduction to switch to a first state and operative in response to the second transistor conduction to switch to the second state.

THE DRAWINGS

DETAILED DESCRIPTION

Figure 1:
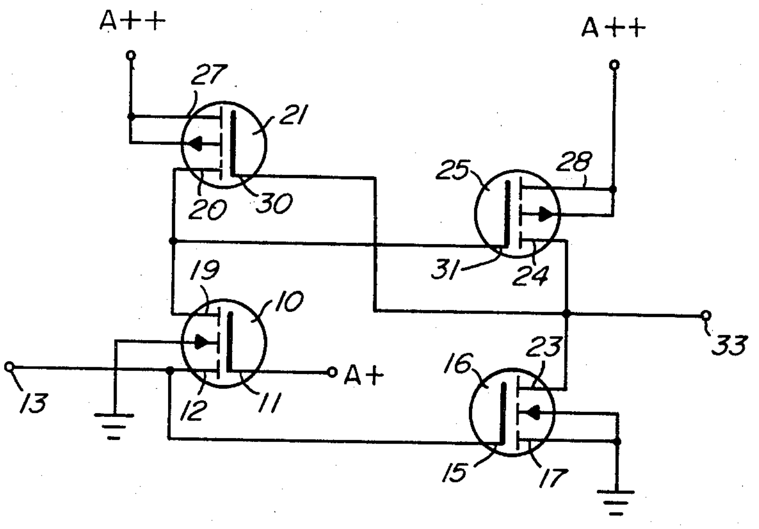
FIG. 1 is one embodiment of a circuit employing the features of this invention.

Referring to FIG. 1, the voltage level shifting circuit shown includes a first transistor 10. Transistor 10 in the embodiment shown is an N-channel field effect transistor (FET). Gate electrode 11 of FET 10 is coupled to A+ potential. In the embodiment shown, A+ potential is approximately 1 volt. Source electrode 12 is coupled to input terminal 13 for receiving the binary input signals therefrom.

Input terminal 13 is also connected to gate electrode 15 of transistor 16. Transistor 16 is an N-channel FET. Source electrode 17 of FET 16 is coupled to ground potential. FETs 10 and 16 act as transistor switches in the voltage level shifting circuit.

Drain electrode 19 of FET 10 is connected to drain electrode 20 of FET 21, and drain electrode 23 of FET 16 is coupled to drain electrode 24 of FET 25. Transistors 21 and 25 are both P-channel field effect transistors. Source electrode 27 of transistor 21 and source electrode 28 of FET 25 are both coupled to A++ potential. A++ potential is a voltage greater than the A+ potential, and in the embodiment shown is approximately 2 volts. Gate electrode 30 of FET 21 is coupled to drain electrode 24 of FET 25, and gate electrode 31 of FET 25 is connected to drain electrode 20 of FET 21. The cross-connection of gate electrodes for FETs 21 and 25 as described above forms a bistable circuit consisting of FETs 21 and 25. That is, with the FETs connected as shown, if FET 21 is conductive, FET 25 will be non-conductive. If FET 25 is conductive, FET 21 will be non-conductive. Output terminal 33 is connected to drain electrodes 23 and 24.

As noted above, FETs 21 and 25 are P-channel FETs and FETs 10 and 16 are N-channel FETs. FETs 10 and 21 in the configuration shown are therefore coupled together in a complementary configuration as are transistors 16 and 25. This complementary configuration provides the low current drain required. FETs 10 and 21 and 16 and 25 are complementary metal oxide semiconductors (CMOS).

In operation, a binary input signal having a voltage level of either zero (reference potential) or 1 volt is coupled to input terminal 13. If a 1 volt signal is coupled to input terminal 13, the 1 volt signal is coupled from input terminal 13 to source electrode 12 and gate electrode 15 of FETs 10 and 16, respectively. The 1 volt signal coupled to FET 10 maintains FET 10 in a non-conductive state. The 1 volt signal coupled to FET 16 renders FET 16 conductive. With FET 16 conductive, drain electrode 23 approaches ground potential. As output terminal 33 is coupled to drain electrode 23 of FET 16, the output signal is approximately 0 volts, or ground potential. This ground potential is also coupled from drain electrode 23 to gate electrode 30 of FET 21 rendering FET 21 conductive. With FET 21 conductive, A++ voltage is coupled from source electrode 27 to drain electrode 20. The A++ voltage developed at drain electrode 20 is coupled to gate electrode 31 of FET 25, causing FET 25 to be maintained in a non-conductive state, and thus insuring the maintenance of a zero voltage level at drain electrode 23 of FET 16.

If ground potential or zero volts is coupled to terminal 13, this signal will be coupled to source electrode 12 of FET 10 and gate electrode 15 of FET 16. The reference potential will render FET 10 conductive and FET 16 non-conductive. With FET 10 conductive, the voltage at drain electrode 19 will approach zero. The zero voltage at drain electrode 19 will be coupled to gate electrode 31 of FET 25 rendering FET 25 conductive. With FET 25 conductive, the A++ voltage at source electrode 28 will be coupled to drain electrode 24. As output terminal 33 is connected to drain electrode 24, an A++ voltage will be coupled to terminal 33. The A++ voltage developed at drain electrode 24 will also be coupled from drain electrode 24 to gate electrode 30 of FET 21 maintaining FET 21 in a non-conductive state.

The above circuit, therefore, responds to a zero voltage or reference potential to develop an A++, or 2 volt, signal and responds to an A+or 1 volt signal to develop a ground or zero voltage. A signal inversion is provided between input and output in addition to this level shifting. If a signal inversion is not desired, output terminal 33 can be connected to the junction of drain electrodes 19 and 20 of FETS 10 and 21, respectively, instead of the junction of drain electrodes 23 and 24. With this connection, a zero voltage signal at input terminal 13 will result in a zero voltage at output terminal 33, and an A+ voltage at input terminal 13 will result in an A++ voltage at output terminal 33.

Figure 2:
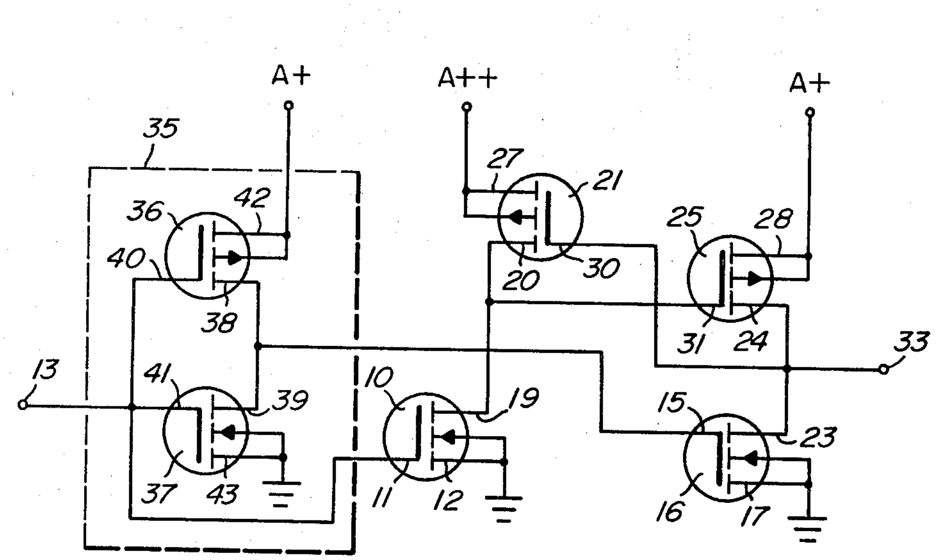
FIG. 2 is a second embodiment of a circuit employing the features of this invention.

Referring to FIG. 2, there is shown a second circuit embodying the features of this invention. Portions of FIG. 2 similar to those in FIG. 1 are given like numbers. In FIG. 2, source electrode 12 of FET 10 is coupled to ground potential and gate electrode 11 of FET 10 is coupled to input circuit 35. Gate electrode 15 of FET 16 is also coupled to input circuit 35, however, gate electrode 15 is not coupled to the same point in input circuit 35 as is gate electrode 11.

Input circuit 35 includes a first FET 36 of the P-channel type, and a second FET 37 of the N-channel type. Drain electrodes 38 and 39 of FETs 36 and 37, respectively, are coupled together, and control electrodes 40 and 41 of FETs 36 and 37 are coupled together and to input terminal 13. Source 42 of FET 36 is coupled to A+ potential and source 43 of FET 37 is coupled to ground potential. Gate electrode 15 of FET 16 is coupled to the junction of drain electrodes 38 and 39, and gate electrode 11 of FET 10 is coupled to the junction of gate electrodes 40 and 41.

Input circuit 35 acts as an inverter for providing an inverted version of the input signal coupled to terminal 13. In this circuit configuration, then, when a ground potential is coupled to terminal 13 this ground potential will be coupled to gate electrode 11, whereas an A+ potential will be coupled to gate electrode 15. When an A+ potential is coupled to input terminal 13, the same A+ potential will be coupled to gate electrode 11, whereas a zero or ground potential will be coupled to gate electrode 15.

In operation, if a 1 volt signal is coupled to input terminal 13, the 1 volt signal is coupled from input terminal 13 to gate electrode 11 of FET 10. The 1 volt signal is also coupled to inverter 35 which inverts the 1 volt signal and develops a zero volt signal at drain electrodes 38 and 39. The zero volt signal is coupled to control electrode 15 of FET 16. The 1 volt signals coupled to gate electrode 11 of FET 10 will render FET 10 conductive, and the zero volt signal coupled to gate electrode 15 of FET 16 will render FET 16 non-conductive. With FET 10 conductive, the voltage at drain electrode 19 will approach zero. The zero voltage at drain electrode 19 will be coupled to gate electrode 31 of FET 25 rendering FET 25 conductive. With FET 25 conductive, the A++ voltage at source electrode 28 will be coupled to drain electrode 24. As output terminal 33 is connected to drain electrode 24, an A++ voltage will be coupled to terminal 33. The A++ voltage developed at drain electrode 24 will also be coupled from drain electrode 24 to gate electrode 30 of FET 21 maintaining FET 21 in a non-conductive state.

If ground potential or zero volts is applied to terminal 13, the zero volt signal will be coupled to inverter 35 and gate electrode 11 of FET 10. Inverter circuit 35 will develop a 1 volt signal at the junction of drain electrodes 38 and 39 in response to the zero volt signal at input terminal 13. The 1 volt signal is coupled from inverter circuit 35 to control electrode 15 of FET 16. The zero volt signal coupled to gate electrode 11 of FET will render FET 10 non-conductive, and the 1 volt signal coupled to gate electrode 15 of FET 16 will render FET 16 conductive. With FET 16 conductive, drain electrode 23 approaches ground potential. As output terminal 33 is coupled to drain electrode 23 of FET 16, the output signal is approximately zero volts, or ground potential. This ground potential is also coupled from drain electrode 23 to gate electrode 30 of FET 21 rendering FET 21 conductive. With FET 21 conductive, A++ voltage is coupled from source electrode 27 to drain electrode 20. The A++ voltage developed at drain electrode 20 is coupled to gate electrode 31 of FET 25, causing FET 25 to be maintained in a non-conductive state, and thus insuring the maintenance of a zero voltage level at drain electrode 23 of FET 16.

As in the example shown in FIG. 1, output terminal 33 can be coupled to the junction of drain electrodes 19 and 20 as opposed to the junction of drain electrodes 23 and 24. With the alternate connection an output signal will be developed that is inverted from the sign of the input signal coupled to terminal 13.

The circuit of FIG. 1 is preferred when it is impossible to connect the source electrodes of the P-channel devices to different voltage supplies. The circuit of FIG. 2 is preferred when a small input current transient cannot be tolerated, and when it is possible to connect the source electrodes of the P-channel devices to different voltage supplies.

As can be seen, an improved voltage level shifting circuit has been provided. The voltage level shifting circuit employs a complementary transistor configuration in order to minimize current drain while in a quiescent condition. The use of complementary metal oxide semiconductors allows the circuit to be easily manufactured in integrated circuit form.

I claim:

1. A voltage level shifting circuit having input means, an output, and a source of potential having a first voltage, a second voltage greater than said first voltage, and a reference potential, said circuit including in combination; bistable means coupled to said output and said source of potential and having a first state for coupling said reference potential to said output and a second state for coupling said second voltage to said output, first and second switch means coupled to said bistable means and to said input means, said first and second switch means being operative to conduct in response to one of said first voltage or reference potential being coupled thereto, said first switch means being conductive only when said second switch means is non-conductive and said second switch means being conductive only when said first switch means is non-conductive, said bistable means operative in response to said first switch means being conductive to switch to said first state, and operative in response to said second switch means being conductive to switch to said second state.

2. The voltage level shifting circuit of claim 1 wherein said bistable means includes first and second transistor means each having first and second principal electrodes and a control electrode, said second principal electrodes being coupled to said second voltage, said first principal electrode of said first transistor means being coupled to said control electrode of said second transistor means and said first principal electrode of said second transistor means being coupled to said control electrode of said first transistor means.

3. The voltage level shifting circuit of claim 2 wherein said first switch means is a third transistor means having first and second principal electrodes and a control electrode, and said second switch means is a fourth transistor means having first and second principal electrodes and a control electrode.

4. The voltage level shifting circuit of claim 3 wherein said first, second, third and fourth transistor means are all field effect transistors.

5. The voltage level shifting circuit of claim 4 wherein said first and third transistor means are opposite conductivity type and said second and fourth transistor means are opposite conductivity type.

6. The voltage level shifting circuit of claim 5 wherein said first and third transistor means first principal electrodes are coupled together, and said second and fourth transistor means first principal electrodes are coupled together.

7. The voltage level shifting circuit of claim 6 wherein said first and second transistors are P-channel field effect transistors, and said third and fourth transistors are N-channel field effect transistors.

8. The voltage level shifting circuit of claim 7 wherein said second principal electrodes are source electrodes and said first principal electrodes are drain electrodes.

9. The voltage level shifting circuit of claim 8 wherein said second switch means gate electrode is coupled to said input means and said second switch means source electrode is coupled to said ground potential.

10. The voltage level shifting circuit of claim 9 wherein said first switch means control electrode is coupled to said input means and said first switch means source electrode is coupled to ground potential.

11. The voltage level shifting circuit of claim 9 wherein said first switch means gate electrode is coupled to said first voltage and said second switch means source electrode is coupled to said input means.

12. A voltage level shifting circuit having input means, an output, a source of potential having a first voltage and a second voltage greater than said first voltage, and a reference potential including in combination; first and second transistors of opposite conductivity type each having first and second principal electrodes and a control electrode, said first and second transistor first electrodes being coupled together, third and fourth transistors of opposite conductivity type each having first and second principal electrodes and a control electrode, said third and fourth transistor first electrodes being coupled together and to said first transistor control electrode, said first and third transistor second electrodes being coupled to said second voltage, said third transistor control electrode being coupled to said first and second transistor first electrodes and said fourth transistor second electrode being coupled to ground potential, first circuit means coupling said input means to said second and fourth transistors and second circuit means coupling one of said first transistor first electrodes and third transistor first electrode to said output.

13. The voltage level shifting circuit of claim 12 wherein said transistors are field effect transistors.

14. The voltage level shifting circuit of claim 13 wherein said first and second transistors are complementary metal oxide semiconductors.

15. The voltage level shifting circuit of claim 14 wherein said third and fourth transistors are complementary metal oxide semiconductors.

16. The voltage level shifting circuit of claim 15 wherein said first electrodes are drain electrodes, said second electrodes are source electrodes and said control electrodes are gate electrodes.

17. The voltage level shifting circuit of claim 16 wherein said first and third transistors are P-channel field effect transistors and said second and fourth transistors are N-channel field effect transistors.

18. A voltage level shifting circuit having input means, an output, a source of potential having a first voltage and a second voltage greater than said first voltage and a reference potential, including in combination; first and second transistors of opposite conductivity type each having first and second principal electrodes and a control electrode, said first and second transistor first electrodes being coupled together, third and fourth transistors of opposite conductivity type each having first and second principal electrodes and a control electrode, said third and fourth transistor first electrodes being coupled together and to said first transistor control electrode, said first and third transistor second electrodes being coupled to said second voltage and said second and fourth transistor second electrode being coupled to said ground potential, said second and fourth transistor control electrodes being coupled to said input means and said third transistor control electrode being coupled to said first and second transistor first electrodes, said output being coupled to one of said first transistor first electrode and third transistor first electrode.

19. A voltage level shifting circuit having input means, an output, a source of potential having a first voltage and a second voltage greater than said first voltage, and a reference potential including in combination; first and second transistors of opposite conductivity type each having first and second principal electrodes and a control electrode, said first and second transistor first electrodes being coupled together, third and fourth transistors of opposite conductivity type each having first and second principal electrodes and a control electrode, said third and fourth transistor first electrodes being coupled together and to said first transistor control electrode, said first and third transistor second electrodes being coupled to said second voltage and said fourth transistor second electrode being coupled to said reference potential, said third transistor control electrode being coupled to said first and second transistor first electrodes, said second transistor second electrode and said fourth transistor control electrode being coupled to said input means, said second transistor control electrode being coupled to said first voltage, and said output being coupled to one of said first transistor first electrode and third transistor first electrode.

* * * * *